United States Patent [19]

Le Maguet

[11] 4,329,638
[45] May 11, 1982

[54] CAPACITIVE VOLTAGE TRANSFORMERS

[75] Inventor: Daniel Le Maguet, Orly, France

[73] Assignee: Enertec, Montrouge, France

[21] Appl. No.: 214,053

[22] PCT Filed: Jan. 23, 1980

[86] PCT No.: PCT/FR80/00007
§ 371 Date: Sep. 23, 1980
§ 102(e) Date: Sep. 19, 1980

[87] PCT Pub. No.: WO80/01516
PCT Pub. Date: Jul. 24, 1980

[30] Foreign Application Priority Data

Jan. 23, 1979 [FR] France .................. 79 01575

[51] Int. Cl.³ ............................................. G05F 1/60
[52] U.S. Cl. ............................ 323/233; 361/17
[58] Field of Search .................. 361/64, 66, 68, 81,
361/17; 323/233, 364

[56] References Cited

U.S. PATENT DOCUMENTS 2,756,414  7/1956  Doremus ................ 323/233 X
3,401,304  9/1968  Woodworth ................ 361/17
3,517,263  6/1970  Okamura et al. ............ 361/17
3,947,725  3/1976  Lucas ...................... 361/17

FOREIGN PATENT DOCUMENTS 1338637  11/1973  United Kingdom ............ 323/364

Primary Examiner—William M. Shoop
Attorney, Agent, or Firm—Dale Gaudier; Mikio Ishimaru

[57] ABSTRACT

The present invention refers to capacitive voltage transformers.

In accordance with one embodiment a capacitive voltage transformer has two capacitors connected in series between a point on a high voltage line and a reference point such as earth and two impedances connected in series with the two capacitors.

A medium voltage electromagnetic detector is connected between the common point of the two capacitors and the common point of the two impedances. An electronic voltage detector is connected to the terminals of the series circuit formed by the two impedances, the values of the latter being selected in order that the instantaneous voltage at the terminals of the electronic detector is always a constant fraction of the voltage taken off between the line and the reference point.

Application to the operation of highspeed static protections from a capacitive voltage transformer having a medium voltage electromagnetic circuit.

12 Claims, 5 Drawing Figures

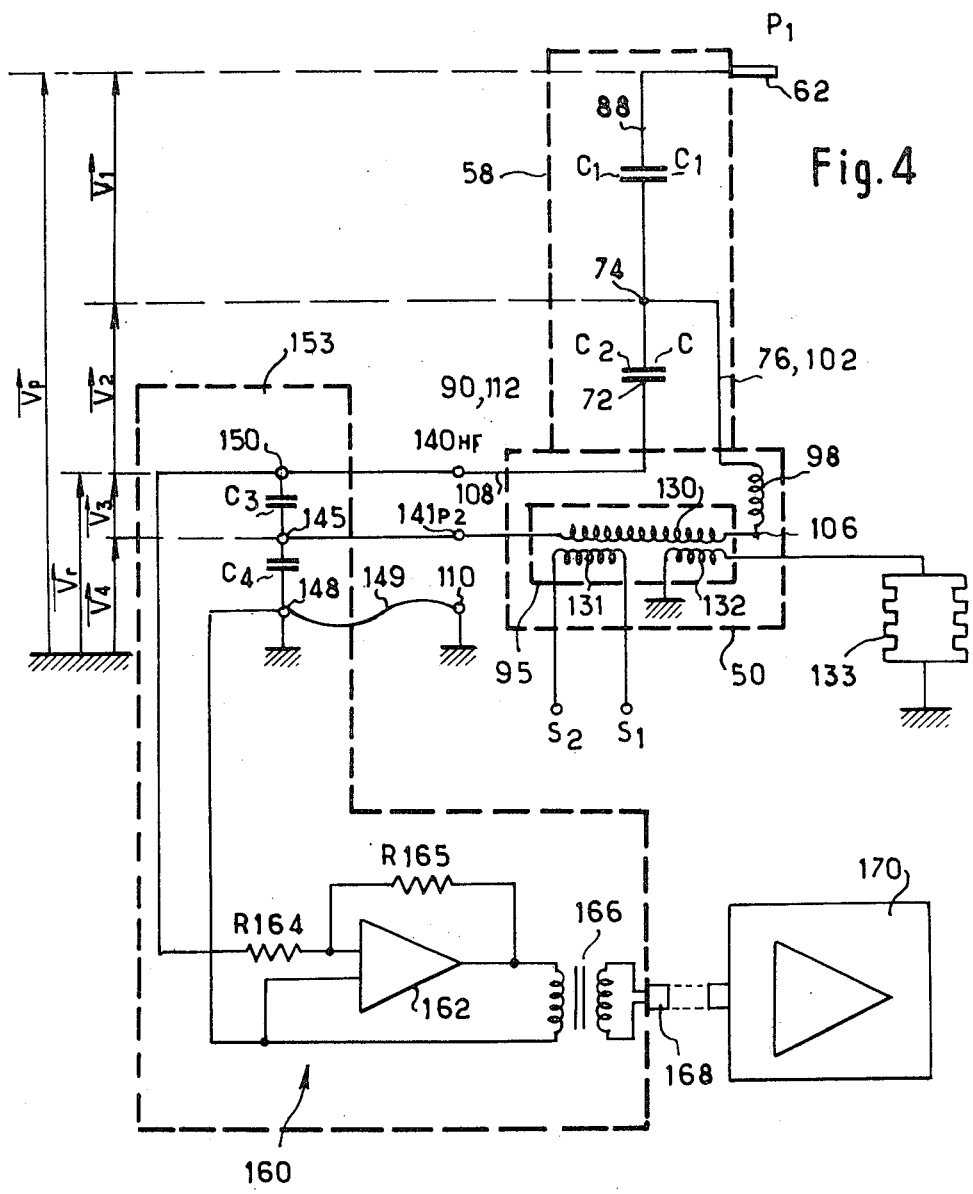
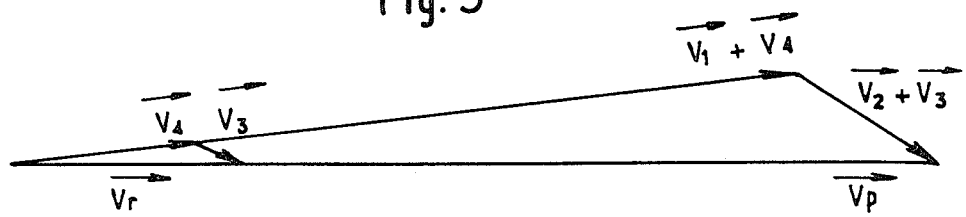

CAPACITIVE VOLTAGE TRANSFORMERS

The present invention relates to capacitive voltage transformers.

FIG. 4 represents diagrammatically the circuit of the transformer as FIG. 3;

FIG. 5 is a vector diagram illustrating the relations between complex voltage signals capable of being present in the circuit as FIG. 4.

Figure 1:
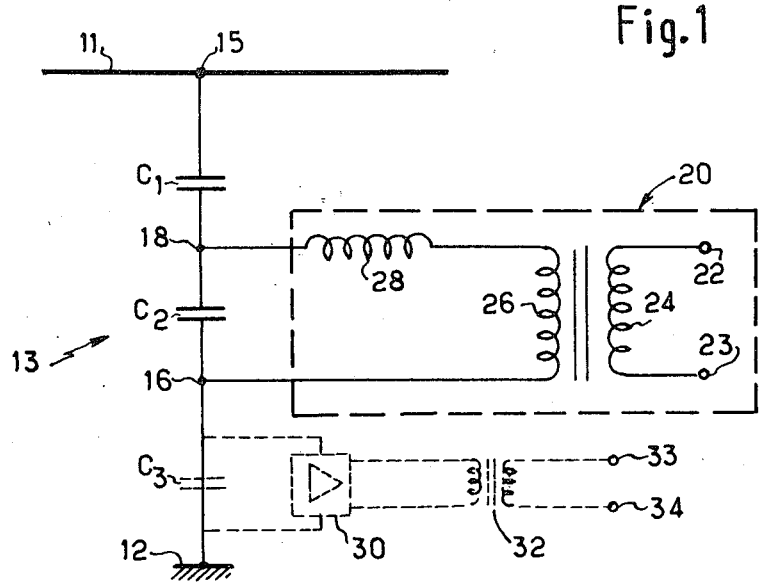
FIG. 1 is a diagram of a conventional capacitive voltage transformer (TCT) with the representation in dotted line of a modification envisaged.

In FIG. 1 a line 11 is shown which has been brought to a high voltage with respect to the earth 12 for the conveyance of electrical energy. A conventional capacitive voltage transformer (TCT) 13 is connected between the line 11 and the earth 12 includes diagrammatically two capacitors $C_1$ and $C_2$ connected in series between a terminal 15 connected to the line 11 and a terminal 16 connected to earth. Between the point of join 18 of the two corresponding ends of the two capacitors $C_1$ and $C_2$ and the terminal 16 is connected a circuit 20 forming the medium voltage detector of the transformer for taking off the voltage at the terminals of $C_2$. This circuit 20 includes essentially a transformer by induction which produces a lowering of voltage and galvanic insulation between the TCT and a load connected to the terminals 22 and 23 of its secondary winding 24, consisting of a device for utilization of the signal which is the image of the voltage of the line (not shown).

The primary winding 26 of this transformer is connected to the terminals 16 and 18 by way of a tuning coil 28.

Transformers of the type diagrammatically described with reference to FIG. 1 are well known and are employed at present for the reduction of the voltage of very high voltage lines providing the conveyance of electrical energy. By choosing suitably the transformation ratio of the circuit 20 and the values of the capacities of the capacitors $C_1$ and $C_2$ in order to obtain a division in a suitable ratio a voltage existing between the line 11 and earth one can reduce the primary voltage of the TCT which may, for example, be 220 KV/$\sqrt{3}$ by passing through an intermediate voltage of 20/$\sqrt{3}$ KV at the terminals of $C_2$. By way of example the capacity of the capacitor $C_1$ may be about 4400 pF and that of the capacitor $C_2$ about 44000 pF. The output voltage from the medium voltage circuit 20 is in general employed for purposes of measurement for feeding pick-ups of 0.5% accuracy, reclosers, load protection, etc.

The interest of capacitive voltage transformers is in enabling the reduction in a very high line voltage to be obtained with a bulk and a price which is in general very much lower than that of conventional ordinary wound transformers. They lend themselves particularly well to the working out of a voltage which is an image of the line voltage for purposes of measurement which do not necessitate the transformation of the power conveyed by the line.

Amongst the applications which necessitate the putting into effect of a reduced voltage which is the image of that of the line 11 there is, however, one to which the conventional TCT do not lend themselves well: it is a question of the protection of the lines against insulation fault within times which become shorter and shorter. The appearance of a fault in an electrical line in general manifests itself by a sudden modification of an operational parameter of the line which is detected in order to trigger as rapidly as possible either an alarm or an interruptor device or more complicated devices. In the latter the line interruption is followed by a reclosure after a predetermined waiting time d with a view to restoring the voltage on the line containing the fault under the assumption that the fault has eliminated itself, or of restoring it in lines which were not directly affected by the fault, once other protective and release devices have isolated the line directly affected by the fault. The modern tendency has been towards the employment of systems of detection for purposes of protection having faster and faster reaction times, in particular with the appearance of static circuits for replacing the prospective circuits having more traditional electro-mechanical relays.

It is in fact advantageous to react as rapidly as possible after the appearance of a fault in order to improve the protection of the networks and to increase the speed of reclosure over portions of the network which are not directly affected by this fault.

Thus, for example, if one considers an installation in which the total admissible time between the appearance of the fault proper and the release of a circuit-breaker entrusted with ensuring the interruption of the line is 60 milliseconds, one arranges that the instrument entrusted with detecting the corresponding modification of the line voltage must provide a useful indication within a time less than 10 milliseconds, the protection having available 20 milliseconds for acting, which leaves a circuit-breaker the remaining 30 milliseconds for carrying out the interruption. The higher the nominal voltage of the line, the shorter are the reaction times allowed for the measurement of the fault voltage and the operation of the protection.

When a TCT is connected to a high voltage line, any fault affecting the latter is expressed by an abrupt variation in the voltage at the terminals of the TCT. A typical case is that of the abrupt earthing of the line 11 which is expressed as a short circuit across the end terminals of the TCT. The abrupt variation in the voltage across the primary of the TCT gives birth to a transitory condition at the secondary of the medium voltage transformer of the latter, which can assume very large proportions and prevent the signal present at the terminals of this secondary from being employed for operating the high-speed protections. This transitory condition is the consequence of the unbalance of the loads existing at the terminals of the parallel connection of the self-inductive circuits 26, 28 and the capacitor $C_2$ at the instant of the disappearance of the primary voltage of the TCT. It introduces a significant error in the reproduction of the variation of the voltage for a period longer than the present standards allow for feeding of highspeed protections.

Thus the appearance of these highspeed protections for very high voltage networks has necessitated the addition in transformer stations of wound voltage transformers. The latter do not display the disadvantage mentioned above at the time of abrupt variations in the voltage across the primary of the TCT. But a substantial increase results in the cost of putting highspeed protection to work. Hence it has been deemed desirable to adapt the TCT in order to enable operation of highspeed protections without having to call upon wound transformers. For this purpose it has been proposed to connect in series with the capacitors $C_1$ and $C_2$ a third capacitor $C_3$ between the terminals 16 and the earth 12 as represented in dotted line in FIG. 1. An electronic amplifier device 30 is connected to the terminals of the capacitor $C_3$ and leaves via a transformer by induction 32 which provides the necessary galvanic insulation for one or more protective devices at the output terminals 33 and 34 from its secondary.

In such a system a transitory condition appears at the terminals of $C_3$ at the time of the birth of a fault affecting the line 11 but its amplitude is greatly reduced with respect to the amplitude of the corresponding transitory condition which appears at the terminals 22 and 23 of the electromagnetic detector. It may be shown in fact that all things being otherwise equal, the relative amplitude (that is to say, referred to the corresponding nominal output voltage) of the aperiodic condition appearing at the time of a short circuit to earth at the terminal 15 of the TCT, at the terminals of the capacitor $C_3$ is divided in the ratio $C_2/C_1$ with respect to that of the electromagnetic detector 20. Hence in the example previously reffered to, it is about 10 times lower. Tests have however shown that in the case of very high voltages, 220 KV and even 400 KV, this system did not enable a signal to be supplied which met the demands for the operation of highspeed static protections in all cases of fault. That is the case in particular for nearly dead short circuits between the terminal 15 at the head of the TCT and earth, the transitory condition always assuming a maximum amplitude when the disappearance of the input signal is produced at the instant of its passing through zero.

Figure 2:
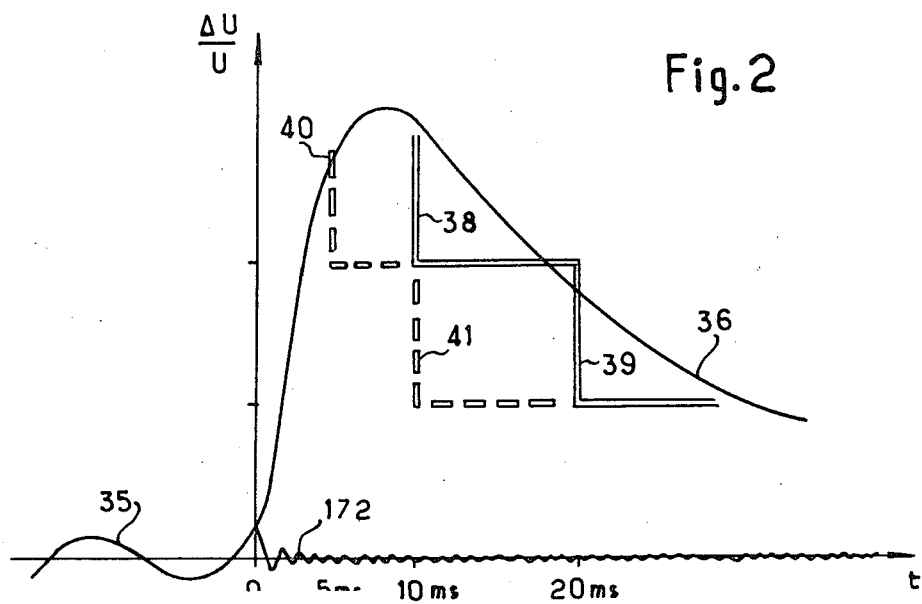
FIG. 2 is a graph representing the variations in the error voltage at the terminals of a transformer of the type represented in FIG. 1 at the time of the appearance of a fault on the line to which the TCT is connected.

FIG. 2 represents the development as a function of time (shown as abscissa) of a signal representing in percentage the error voltage created by the transitory condition. This error voltage $\Delta U/U$ is defined in accordance with CEI (Comité d'Electronique International) standards: $\Delta U$ is the differential voltage measured by placing in opposition the measured voltage (taken at the terminals of $C_3$) and the secondary voltage given by a standard capacitive divider connected to the primary voltage and having a voltage ratio equal to the nominal transformation ratio obtained for the voltage at the terminals of $C_3$. U is the nominal crest value of the secondary voltage (at the terminals of $C_3$) before the appearance of the fault. $\Delta U/U$ is shown as the ordinate.

It is assumed that a fault affecting the line 11 appears at the origin of the axes of the coordinates. Before the point O the signal $\Delta U/U$ had a sinusoidal form as represented by the wave 35. At the instant of the appearance of the fault the wave 35 disappeared abruptly; it is replaced by an aperiodic wave 36 which is the sharper, the nearer the primary voltage was to zero at the instant of the fault and the amplitude of which is reduced gradually until reaching a level zero. In accordance with the standards at present in force for a nominal primary voltage of 220 kV, in order to be able to operate a highspeed protection the signal 36 must decrease sufficiently rapidly to reach an amplitude less than 0.30% at the end of 10 milliseconds after the appearance of the fault and less than 0.15% at the end of 20 milliseconds after the appearance of the fault. These thresholds may be represented by windows diagrammatically defined by solid vertical lines 38 and 39 in FIG. 2. When the nominal voltage at the primary of the transformer is 400 kV the thresholds previously referred to are 0.30% after 5 milliseconds and 0.15% after 10 milliseconds as shown by the windows in dotted lines 40 and 41. Hence the required standards for producing a signal capable of feeding a highspeed protection are extremely strict and the more so that this signal must satisfy the conditions mentioned above whatever the cause which has been the origin of the fault and including the case of a primary short circuit at the instant of the voltage passing through zero.

In addition one must keep to the spirit that the voltage reducer must enable the required feed signal to be obtained even when other equipments are likewise fed by this reducer, either equipments connected to the electromagnetic portion of the TCT or other highspeed protection circuits.

As regards these difficulties one aim of the present invention is to provide a TCT which enables a signal to be delivered which is representative of the voltage in a line affected by a fault, which enables highspeed distance protections to be operated with satisfactory reliability.

For this purpose, in accordance with one aspect of the invention, a capacitive voltage transformer has been conceived of for the reduction of a high voltage to a lower representative voltage, including: an input terminal intended to be connected to a line under voltage; a first and a second impedance formed respectively by a first and a second capacitor;
a third and a fourth impedance forming a series circuit and having a common join;
the second and third impedance having a common end and the said first, second, third and fourth impedances being connected in series between the said input terminal and a point on a reference medium brought in operation to a reference voltage;
first means of taking off a voltage between the other end of the second impedance and the join common to the third and fourth impedances; and second means of producing a voltage signal which is a function of the voltage across the terminals of the series circuit formed by the third and fourth impedances,
the values of the third and fourth impedances with respect to those of the first and second impedances being such that the instantaneous amplitude of the said voltage signal is a predetermined fraction of the input voltage appearing in operation between the input terminal and the reference medium.

Thus the relationship maintained between the primary voltage and the voltage at the terminals of the circuit of the third and fourth impedances enables it to be avoided that the latter voltage is influenced by the first means of take-off of voltage. Hence the signal produced by the second means enables the operation of protections by providing constantly a faithful reduced image of the primary voltage even when the appearance of a fault creates in the secondary circuit of the medium voltage portion a transitory condition of high amplitude capable of disturbing the output signal from the latter for a time which is not negligible.

Other aspects and advantages of the invention will become clearly apparant by referring to an embodiment which will now be described by referring to FIGS. 3 to 5.

Figure 3:
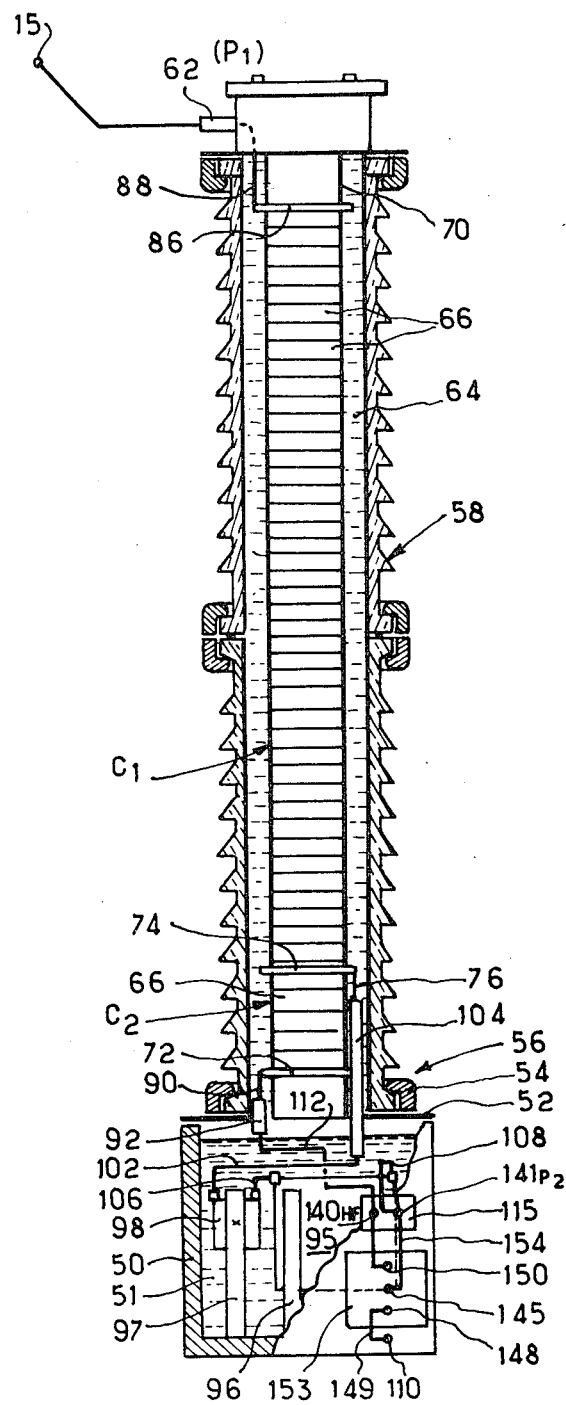
FIG. 3 is a sectional elevation of a conventional TCT equipped in accordance with the invention.

If one now refers to FIG. 3, a capacitive voltage transformer for 220 kV networks as shown includes in its lower portion a tank 50 which is normally earthed and filled with an insulating fluid such as oil 51. The upper portion of the tank 50 is closed by a cover 52 upon which is mounted a conventional hollow insulating column having rings 58, the length of which is typically of the order of two meters. The base 56 of this column is attached hermetically onto the upper portion of the cover 52 by claws 54.

At the upper portion of the column appears an electrical connection terminal 62 referenced with the symbol P1. The interior of the column is filled with an insulating oil 64 in which are immersed two capacitors $C_1$ and $C_2$, formed by stacks of capacitive elements 66 mounted above the cover 52, which may be aluminium-paper capacitors, oil impregnated, of conventional type or any other suitable capacitive system.

The capacitor $C_2$ proper consists of a first stack of capacitive elements 66 at the bottom of the column, connected in series and forming in the present example a capacity of 44000 pF. It includes a lower fitting 72 in the vicinity of the bottom of the column and an upper fitting 74.

The fitting 74 forms the lower fitting of the capacitor $C_1$ which consists of a stack of a number of capacitive elements 66 about ten times higher than that of $C_2$ for a capacity of 4400 pF. The upper fitting 86 of $C_1$ is connected by a conductor 88 to the terminal 82 at the head of the TCT. The terminal 62 is intended to be connected at the point 15 to the very high voltage line.

Inside the tank 50 of the TCT a voltage transformer 95 of induction type is immersed in the fluid 51. It rests upon supports 96 which in turn are integral with the bottom of the tank. Another support 97 carries a casing containing a tuning coil 98 connected in series with the primary of the transformer 95. One of the terminals of the coil 98 is connected by the conductors 102 and 76 to the upper fitting 74 through the cover 52 (insulating bushing 104). One end of the primary of the transformer 95 is connected to the other end terminal of the coil 98 by a conductor shown diagrammatically at 106, the other end of the primary being connected by a conductor shown diagrammatically at 108 to a terminal 141 (P2) projecting outside the tank 50. A conductor 90 passing through a vertical insulating bushing 92 through the cover 52 and extended by a cable 112 connects the fitting 72 of the capacitor $C_2$ to a terminal 140 (HF) likewise projecting on the outside of the tank. The run of the conductors mentioned has been represented diagrammatically.

A terminal 110 earthed to the tank 50 projects sideways through the vertical wall of this tank close to an insulating support 115 which receives from the tank two bushings of insulating material inside which are embedded conductors which end in the two terminals 140 (HF) and 141 (P2). The terminals of the secondary of the transformer ($S_1$ and $S_2$) are not visible in FIG. 3. A metal casing 153 is attached by means not shown onto the sidewall of the tank 50. It exhibits on its outer face a terminal 150 connected electrically to the terminal HF 140, a terminal 145 connected to the terminal 141 by a cable and an earthing terminal 148 connected by a cable 149 to the terminal 110 of the tank 50. These three terminals are connected to two capacitors inside the casing 153 for putting the invention into effect. This casing likewise exhibits an outlet not visible in the Figure for a connecting cable to a relay building.

In a conventional TCT the terminals 140 and 141 of which are earthed in a similar way to the diagram in solid line in in FIG. 1, the primary voltage, that is to say, the voltage existing between the line to which the terminal $P_1$ is connected and earth, is typically $$\frac{220 \text{ kV}}{\sqrt{3}},$$

the voltage at the terminals of the capacitor $C_2$, that is to say, between the two fittings 72 and 74, is typically $$\frac{20 \text{ kV}}{\sqrt{3}};$$

the voltage between the terminals $S_1$ and $S_2$ for the low voltage output from the induction transformer 95 is typically $$\frac{100 \text{ V}}{\sqrt{3}};$$

it is this latter voltage which is in general employed for the purpose of supervising the value of the line voltage as well as with a view to carrying out certain reclosing operations. However, as has previously been explained, there are cases where the low voltage appearing between the terminals $S_1$ and $S_2$ of the transformer 95 does not provide a sufficiently faithful image of the line voltage at the time of abrupt variations of the latter for enabling highspeed protections to be operated, because of the aperiodic condition which then originates under the effect of the connection in parallel of the self-inductive circuit formed by the primary of this transformer with the capacity $C_2$.

Having thus in mind the material context of the invention one may refer for convenience of explanation to the electrical diagram of FIG. 4 in which appear the parts which have just been described with reference to FIG. 3. The same reference numbers have been employed whilst the symbolic representations of the electrical components replace their geometrical of mechanical representations of FIG. 3.

Very briefly one finds again in FIG. 4 the input terminal 62 ($P_1$) at the head of the TCT, the capacitors $C_1$ and $C_2$ in series, the tuning coil 98 in series between the fitting 74 common to the capacitors $C_1$ and $C_2$ and the primary of the magnetic transformer 95, the latter winding being designated by the reference 130 in FIG. 4. The secondary winding of the transformer 95 is designated by the reference 131 with its outputs $S_1$ and $S_2$. A second secondary winding 132 is provided for the transformer 95 which feeds via a damping load 133 in accordance with conventional technique.

In the casing 153 two capacitors $C_3$ and $C_4$ are mounted in series between the terminals 150 and 148, the capacities of which are selected in the way explained above. The point of join of the connected fittings on these two capacitors is connected to the outer terminal 145 already mentioned, which in turn is connected by the terminal 141 (P2) to the primary winding 130 of the electromagnetic transformer 95.

The other fitting of $C_3$ is connected by way of the terminals 150 and 140 (HF) to the fitting 72 on the capacitor $C_2$. The other fitting on $C_4$ is connected to the terminal 148 of the casing which is represented as connected to the earthing terminal 110.

However, provision is made for being able to connect a system of injection or reception of a high-frequency signal HF between the terminals 110 and 148 in order to enable transmission of information over the power lines in accordance with a conventional technique with the TCT. In a conventional transformer TCT such an injection or reception circuit normally comes to be connected between the terminals 110 and 140, the terminal 141 being earthed.

The total capacity of the TCT which as has been seen is about 4000 pF is determined as a function of the conditions of transmission of information at high frequency (HF) along lines for the conveyance of energy. This information is injected or picked up at the level of the transformer by means of a resonant circuit of which the TCT forms the capacitive element and which is completed by an induction coil connected in series at the head of the transformer and not shown.

The capacitors $C_3$ and $C_4$ form a series circuit having a common join 145, the terminals 150 and 148 enabling the voltage to be taken off at the terminals of this series circuit by a voltage detector 160. The latter is housed in the casing 153 and is composed essentially of an electronic preamplifier 162, R164 and R165 which adapts the voltage $$\left(\text{typically } \frac{100}{\sqrt{3}} \text{ volts}\right)$$

at the terminals 150-148 to a level of, for example, 5 volts transmitted to the primary of an insulating transformer 166 the secondary of which is connected by cable 168 to a relay building where an amplifier 170 deals with the signal for the operation of the protections.

The capacitor $C_3$ is in series with $C_2$, the induction transformer 95 being connected to the terminals of the series circuit $C_2$, $C_3$. The capacitor $C_4$ is connected between the capacitor $C_3$ and earth (possibly through a circuit for high frequency injection or detection as has been mentioned).

Hence in order to understand the operation of the circuit as FIG. 4 it may be seen that four capacitors $C_1$, $C_2$, $C_3$, $C_4$ are connected in series between the primary terminal 62 (P1) of the transformer and earth (earthing terminal 110).

The voltage at the terminals of $C_2$ and $C_3$ is taken off between the connections 74 and 145 by the induction transformer 95 or medium voltage detector which delivers a corresponding signal to the terminals $S_1$ and $S_2$ of its secondary. The voltage at the terminals of $C_3$ and $C_4$ is taken off between the connections 148 and 150 by the electronic detector 160. One and the same current passes through $C_2$ and $C_3$ and under sinusoidal conditions the respective voltages at their respective terminals are collinear.

Through $C_1$ and $C_4$ likewise passes one and the same current and, the input impedance of the detector 160 being high, this current is practically equal to the total current between the terminal $P_1$ and earth. Under sinusoidal conditions the respective voltages at their terminals are collinear. Hence referring to the diagram of a conventional TCT the association of $C_1$ and $C_4$ corresponds functionally with the capacitor $C_1$ in FIG. 1. In accordance with one aspect of the invention it is possible by choosing the values of $C_3$ and $C_4$ suitably with respect to those of $C_2$ and $C_1$ respectively to make the voltage taken off by the electronic detector 160 practically independent of the existence of the electromagnetic detector 95 whatever the conditions but without modifying the transformation ratio of the latter.

The capacities of the capacitors $C_3$ and $C_4$ are chosen so that their ratio is equal to the ratio of the capacities of the capacitors $C_2$ and $C_1$ respectively.

$$(C_1/C_2) = (C_4/C_3) \tag{I}$$

or in other words $$(C_4/C_1) = (C_3/C_2) = \alpha, \tag{II}$$

$\alpha$ being a coefficient which may be of the order of 2000, for example. If one considers the instantaneous values of the differences in voltage, $V_1$, $V_2$, $V_3$, $V_4$ which exist at the terminals of the capacitances $C_1$, $C_2$, $C_3$ and $C_4$ respectively and the difference in voltage $V_p$ between the primary terminal 62 and earth one can write:

$$V_p = V_1 + V_2 + V_3 + V_4 \tag{III}$$

and taking into account the relationship (II)

$$V_3 = (1/\alpha)V_2 \tag{IV}$$

$$V_4 = (1/\alpha)V_1 \tag{V}$$

whence by combining (IV) and (V) with (III)

$$V_3 + V_4 = V_p/1 + \alpha) \tag{VI}$$

Hence the voltage difference at the terminals of the series circuit formed by the connection of the capacitors $C_3$ and $C_4$ is at every instant representative in algebraic value of the primary voltage, independently of the permanent or aperiodic conditions of the latter. In particular if $V_p$ is abruptly eliminated in consequence of a dead short circuit upon the line to which the primary of the transformer TCT is connected, the voltage between the terminals 150 and 148 is likewise eliminated without being affected by the transitory conditions which are established at the terminals of each of the capacitors $C_1$ to $C_4$ taken individually because of the circuit formed by the self-inductance 98 and the transformer 95.

However, the relationship existing between the voltage $V_3 + V_4$ which appears between the terminals 150 and 148 and the primary voltage remains true even in the absence of short circuit. In order to help in grasping clearly the operation of the invention one can refer, for example, to the case of the permanent conditions of the primary voltage. In this case one may consider the voltage vectors $\vec{V}_1$, $\vec{V}_2$, $\vec{V}_3$, $\vec{V}_4$ corresponding with the voltages at the terminals of the capacitors $C_1$, $C_2$, $C_3$, $C_4$ respectively. The vectorial sum of these four voltages is equal to the voltage $\vec{V}_p$ or the primary voltage of the TCT.

In FIG. 5 it may be seen that the vectors $\vec{V}_4$ and $\vec{V}_3$ have a resultant $\vec{V}_r$ which is the voltage present between the terminals 150 and 148. The total primary voltage between P1 and earth, $\vec{V}_p$, is in turn the vectorial sum of the collinear voltages $\vec{V}_1 + \vec{V}_4$ on the one hand and of the collinear voltages $\vec{V}_2 + \vec{V}_3$ on the other. In practice, $\vec{V}_3$ and $\vec{V}_4$ have been represented in the Figure much larger than they are in reality and it may be considered that $\vec{V}_p$ is the vectorial resultant of $\vec{V}_1 + \vec{V}_2$. Thanks to the relationship of proportionality existing between the amplitudes of $\vec{V}_1$ and $\vec{V}_4$ and of $\vec{V}_2$ and $\vec{V}_3$, $\vec{V}_r$ is aligned with $\vec{V}_p$ and provides an image of the primary voltage which is constantly in phase with it under permanent conditions.

Hence this image amplified by the detector 160 may be employed for other purposes than the feeding of highspeed protections. A major interest of this image signal remains, however, that it reflects instantaneously and faithfully the variations in the primary voltage.

In every case the relationship (VI) is strictly valid only if the relationships (IV) and (V) remain exact, which implies that the input impedance of the voltage detector 160 is high.

This condition is satisfactorily achieved with an electronic preamplifier.

It will be observed finally that in the case where capacitors such as $C_3$ and $C_4$ are employed the faithfulness of the voltage image at the terminals of $C_3$, $C_4$ is not affected by the variations in frequency of the network in which the TCT is connected, nor by the loads applied at the output from its electromagnetic detector.

As far as the dimensioning of the capacitors $C_3$ and $C_4$ is concerned, the values selected in the example described are substantially the following:

$$C_3 = 100 \ \mu F$$

$$C_4 = 10 \ \mu F$$

These values are dictated by the equation (VI) which fixes the value of $\alpha$ when it has been determined that the input voltage to the input detector is close to $$\frac{100 \ V}{\sqrt{3}}.$$

It must be observed that this arrangement may be adopted without modifying the transformation ratio of the transformer and in particular of its electromagnetic portion. In a conventional TCT represented in FIG. 1 this ratio is a function of the ratio of the capacities $C_1/C_2$ of the capacitive divider. In the circuit as FIG. 4 the value of this ratio $C_1 + C_4/C_2 + C_3$ is not modified. It must be observed that such would not be the case for the modification represented in dotted line in FIG. 1.

In the case of an application of the invention to a TCT for a 400 kV network, the capacitors $C_1$ and $C_2$ of which have as their respective capacities:

$$C_1 = 4250 \ pF$$

$$C_2 = 80000 \ pF$$

the values of $C_3$ and $C_4$ are the following:

$$C_3 = 200 \ \mu F$$

$$C_4 = 10 \ \mu F.$$

In FIG. 2 the results of tests are shown, which have been carried out by putting the invention into effect for the values of capacity $C_1$ to $C_4$ corresponding with a TCT of 220 kV. The relative error signal $\Delta U/U$ is represented as previously by 35 before the fault. After the short circuit of the primary at the point 0 of origin of the times, the error signal 172 merges with the residual noise and passes very largely through the windows 38 and 39 imposed by the standards for employment with highspeed protections.

The system in accordance with the invention may advantageously be employed for equipping TCT's already existing on systems of networks for conveyance of energy, which must be equipped with highspeed static protections. This results clearly from FIG. 3 which illustrates how a conventional device may be equipped in accordance with the invention. On such a TCT which normally includes the terminals 140 (HF) and 141 (P2) the screened casing 153 has been fixed to the tank 50 to form a screened enclosure in which are mounted the two capacitors $C_3$ and $C_4$ which may be of the same technology as $C_1$ and $C_2$, and the detector 160. The possibility of adaptation which has just been described is particularly advantageous for the equipment at lowest cost with highspeed protections, of networks already equipped with measuring transformers of capacitive type.

However, TCT's putting the invention into effect may be constructed directly for new installations. They can then allow the advantages of an electromagnetic detection from the medium voltage prevailing at the terminals of the capacitor $C_2$ for certain measuring applications which necessitate a certain measuring power, to be allied with the possibility of detecting rapidly the appearance of a fault affecting the line to which the TCT is connected, for feeding highspeed protections as has been said.

The embodiment which has just been described enables an image to be obtained which is representative of the voltage at the terminals of a TCT which is insensitive to the transitory conditions from its electromagnetic secondary, in a way which is particularly simple and adaptable to existing installations.

The invention is not necessarily restricted to this preferred embodiment in which the impedances at the terminals to which the electronic detection is going to be connected, are realised by means of capacitances $C_3$ and $C_4$. In fact other types of combinations of impedances than capacitive ones may be envisaged in order to generate a voltage representative of that of the line at any instant. An impedance $Z_3$ may be mounted in series with $C_2$ and in parallel with the medium voltage electromagnetic detector, whilst another impedance Z4 forms with $Z_3$ a series circuit and is connected in series with the electromagnetic detector and the capacitors $C_1$ and $C_2$. It is then possible to determine the values $Z_3$ and Z4 and the connection to the terminals of the series circuit $Z_3$, Z4 of a suitable detection circuit, in such a way that the output from this circuit is at any instant a fraction of the primary voltage of the TCT whatever the conditions on the line being supervised.

In general the voltage picked up at the terminals of the two impedances such as $Z_3$, Z4 is capable of following the variations in the primary voltage of the TCT in a way which is independent of the characteristics of the electromagnetic portion of the latter, on condition that the ratio of division of voltage formed by $C_2$ and $Z_3$ is the same as the ratio of division formed by $C_1$ and Z4. Under these conditions the transfer function defined by the ratio of the voltage at the terminals of the series circuit $Z_3$, Z4 to the primary voltage is independent of the electromagnetic portion of the TCT. Hence it is possible to derive from the signal taken off at the terminals of $Z_3$, Z4 a signal which is constantly representative of the variations in the primary voltage whatever the conditions of the latter.

It must likewise be observed that the system described for the measurement of the primary voltage enables one to rid oneself of the transitory conditions which might originate through the effect of any other quadripole than the electromagnetic detector envisaged hitherto, this quadripole being connected to the terminals of the series circuit $C_2$, $Z_3$ and supplying a load which is capable of varying.

I claim:

1. A capacitive voltage transformer for the reduction of a high voltage to a lower representative voltage, including:
   an input terminal intended to be connected to a line under voltage;
   a first and a second impedance formed respectively by a first and
   a second capacitor;
   a third and a fourth impedance forming a series circuit and having
   a common join;
   the second and third impedances having a common end and the said first, second, third and fourth impedances being connected in series between the said input terminal and a point on a reference medium brought in operation to a reference voltage;
   first means of taking off a voltage between the other end of the second impedance and the join common to the third and fourth impedances; and
   second means of producing a voltage signal which is a function of the voltage across the terminals of the series circuit formed by the third and fourth impedances,
   the values of the third and fourth impedances with respect to those of the first and second impedances being such that the instantaneous amplitude of the said voltage signal is a predetermined fraction of the input voltage appearing in operation between the input terminal and the reference medium.

2. A transformer as in claim 1 in which the ratio of division of voltage formed by the first and the fourth impedances is equal to that of the voltage divider formed by the second and the third impedances.

3. A transformer as in claim 1 or 2 in which the first and second impedances have a commond end.

4. A transformer as in claim 1 or 2 in which the first impedance is connected to the input terminal and the series circuit formed by the third and fourth impedances is connected between the second impedance and the point on the reference medium.

5. A transformer as in claim 1 or 2 comprising means of transformation of voltage by induction, connected to the first means of take-off in parallel with the second and third impedances.

6. A transformer as in claim 1 or 2 in which the said second means include connection terminals at the non-common ends of the said third and fourth impedances.

7. A transformer as in claim 1 or 2 in which the second means comprise an electronic amplification circuit.

8. A transformer as in claim 1 or 2 in which the fourth and the third impedances comprise
   a fourth and a third capacitance respectively, the ratio between the values of which is equal to the respective ratio between the capacities of the first and second capacitors.

9. A transformer as in claim 8 in which the values of the third and fourth capacitances are of an order of magnitude about a thousand times greater than that of the second and first capacitances respectively.

10. A capacitive voltage transformer for the reduction of a high voltage to a representative voltage, comprising:
    a terminal intended for connection to a line at high voltage;
    a first capacitor mounted upon a column intended to be fixed vertically, the said terminal being connected electrically to a fitting on the said capacitor at the upper portion of the said column;
    a second capacitor having a higher capacity than that of the first capacitor and connected in series with the first capacitor between the said terminal and a medium intended to provide a reference voltage;
    a third and a fourth capacitor having a common join and connected in series with the first and second capacitors between the said terminal and the said medium;
    means of electronic amplification for producing a voltage signal which is a function of the voltage at the terminals of the series circuit formed by the third and fourth capacitors; and
    a transformer by induction for developing a signal representative of the voltage between a point on the connection between the first and the second capacitors and the point of join of the third and fourth capacitors.

11. Equipment for a capacitive voltage transformer intended to be connected to a line at high voltage with a view to producing a signal representative of the condition of this line for the purpose of alarm or protection, the capacitive voltage transformer including in known manner a terminal intended to be connected to the high voltage line; a first capacitor connected to the said terminal and a second capacitor connected in series with the first capacitor between this terminal and a medium normally brought to a reference voltage; and a transformer by induction the primary of which has one end connected to a point on the connection between the first and the second capacitor and in parallel with the second capacitor in order to supply at its secondary a signal of reduced amplitude representative of the high voltage of the line, the said equipment comprising:
    a first and a second impedance suitable for being connected in series with the first and second capacitors between the latter and the medium at reference voltage, the first impedance but not the second being in parallel with the primary of the transformer;
    means comprising an electronic detector for developing a voltage signal which is a function of the voltage at the terminals of the series circuit formed by the first and second impedances;
    the relative values of these impedances with respect to the relative capacities of the first and second capacitors being such that in this connection the instantaneous value of the voltage signal developed is a constant fraction of the instantaneous amplitude of the voltage appearing in operation between the said high voltage terminal and the said medium.

12. A method of equipping a capacitive voltage transformer
    suitable for connection to a high voltage line with a view to deriving from it signals suitable for being employed for the operation of highspeed protection devices in the event of fault affecting the line, the capacitive voltage transformer including conventionally a terminal intended for connection of it to the high voltage line, a first capacitor connected to the said terminal and a second capacitor connected in series with the first capacitor between this terminal and a medium normally brought to a reference voltage, and a transformer by induction connected in series with the first capacitor and in parallel with the second in order to provide a signal representative of the voltage of the line, being a method in accordance with which a first and a second impedance having a common join are mounted in series with the first and the second capacitor between the latter and the medium at reference voltage, the first impedance but not the second being in parallel with the transformer by induction, the said first and second impedances being selected as a function of a capacities of the first and second capacitors so that the instantaneous amplitude of a voltage signal derived from a take-off at the terminals of the series circuit formed by the first and the second impedances is a constant fraction of the instantaneous amplitude of the voltage between the high voltage terminal and the reference medium, which can be developed directly by means of electronic circuits.

* * * * *